United States Patent
Zhao et al.

(10) Patent No.: US 10,192,905 B2
(45) Date of Patent: Jan. 29, 2019

(54) ARRAY SUBSTRATES AND THE MANUFACTURING METHODS THEREOF, AND DISPLAY DEVICES

(71) Applicant: Shenzhen China Star Optoelectronics Technology Co., Ltd., Shenzhen, Guangdong (CN)

(72) Inventors: Wei Zhao, Guangdong (CN); Xiangyang Xu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 80 days.

(21) Appl. No.: 15/328,637

(22) PCT Filed: Jan. 17, 2017

(86) PCT No.: PCT/CN2017/071327
§ 371 (c)(1),
(2) Date: Jan. 24, 2017

(87) PCT Pub. No.: WO2018/090482
PCT Pub. Date: May 24, 2018

(65) Prior Publication Data
US 2018/0211985 A1 Jul. 26, 2018

(51) Int. Cl.
*H01L 27/12* (2006.01)
*H01L 21/3065* (2006.01)
*H01L 21/02* (2006.01)

(52) U.S. Cl.
CPC ...... *H01L 27/1288* (2013.01); *H01L 21/0262* (2013.01); *H01L 21/3065* (2013.01); *H01L 27/1214* (2013.01); *H01L 27/1222* (2013.01); *H01L 27/1259* (2013.01)

(58) Field of Classification Search
CPC ................. H01L 27/1214; H01L 27/1288
See application file for complete search history.

(56) References Cited

U.S. PATENT DOCUMENTS 8,962,404 B2 * 2/2015 Bai ................. H01L 27/1288
438/149

* cited by examiner

*Primary Examiner* — Quoc Hoang
(74) *Attorney, Agent, or Firm* — Andrew C. Cheng

(57) ABSTRACT

The present disclosure relates to a manufacturing method of array substrates, wherein a second masking process forming an active layer, a source electrode and a drain electrode further includes: forming a semiconductor thin-film layer, N+ doping thin-film layer, a metal thin-film layer, and a photo-resistor layer on a gate insulation layer in sequence; applying a gray-tone-mask process to expose and develop the photo-resistor layer to obtain a first photo-resistor mask; applying a first wet etching process and a first dry etching process to etch the metal thin-film layer, the semiconductor thin-film layer, and the N+ doping thin-film layer; applying a plasma ashing process to the first photo-resistor mask to obtain a second photo-resistor mask; applying a second wet etching process to etch the metal thin-film layer; and peeling off the second photo-resistor mask, applying a second dry etching process to etch the N+ doping thin-film layer. The present disclosure also relates to the array substrate formed by the above manufacturing method and the display device having the array substrate.

18 Claims, 7 Drawing Sheets

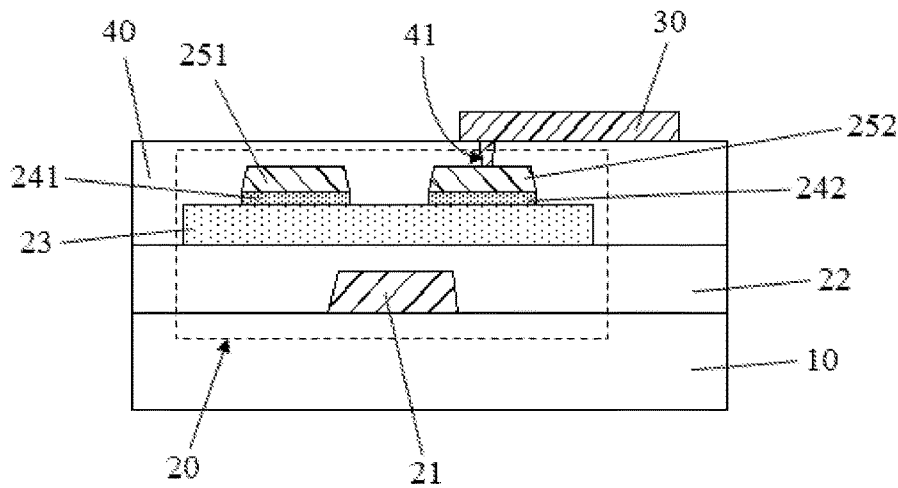

FIG. 2

| applying a first masking process to the substrate to form a gate electrode; | S1 |

| forming the gate insulation layer covering the gate electrode on the substrate; | S2 |

| applying a second masking process to form the active layer, the source electrode and the drain electrode on the gate insulation layer; | S3 |

| forming a passivation layer covering at least one thin film transistor (TFT) on the substrate; | S4 |

| applying a third masking process to form at least one through hole within the passivation layer | S5 |

| applying a fourth masking process to form at least one pixel electrode on the passivation layer, wherein the pixel electrode electrically connects to one of the source electrode and the drain electrode via the through hole | S6 |

FIG. 3

ARRAY SUBSTRATES AND THE MANUFACTURING METHODS THEREOF, AND DISPLAY DEVICES

BACKGROUND OF THE INVENTION

1. Field of the Invention

The present disclosure relates to liquid display technology, and more particularly to a display device having the array substrate.

2. Discussion of the Related Art

Thin-film transistor (TFT) is a key component of flat display device, which may be formed on the glass substrate or a plastic substrate. Usually, the TFT may operate as a lighting device and a driving device incorporated with LCD or OLED. The Thin-film Transistor Liquid Crystal Display (TFT-LCD) is characterized by attributes such as small dimension, low power consumption, and no radiations, and thus has been the main trend in the flat display market.

The array substrate of the TFT-LCD may be formed by structure patterns formed by a plurality of masking processes. Each of the masking process includes coating, exposure, development, etching and peeling, respectively, wherein the etching process may include dry etching and wet etching. The number of masking steps may be adopted to evaluate the complexity of the manufacturing process of the array substrate. That is, the manufacturing cost may be reduced by decreasing the number of manufacturing steps. The number of the steps within the manufacturing process of TFT array substrates evolves from 7Mask to 5Mask. Currently, 5Mask solution has become the mainstream of the manufacturing process of the TFT-LCD array substrates. 5Mask solution includes 5 mask processes, including gate electrode mask, Active layer mask, S/D mask, Via mask, and a pixel electrode mask (Pixel Mask).

At present, in order to further reduce manufacturing cost, some manufacturers begin to use 4Mask solution, which bases on the 5Mask solution plus the GrayToneMask process, Active Mask process and S/D Mask process, so as to form a Mask. By adjusting the etching process (Etch), the original Active Mask and S/D Mask function may be completed, that is, the technical effect of Mask process may be completed through a Mask process.

Referring to FIG. 1a-1g, with respect to the 4Mask process, the second masking process is adopted to form the active layer, the source electrode, and the drain electrode. The second masking process includes the following steps:

(1) As shown in FIG. 1a, a semiconductor thin-film layer 2, a N+ doping thin-film layer 3, a metal thin-film layer 4, and a photo-resistor layer 5 are formed on an gate insulation layer 1 in sequence.

(2) As shown in FIG. 1b, the GrayToneMask process is applied to the photo-resistor layer 5 to obtain a first photo-resistor masking 5a.

(3) As shown in FIG. 1c, under the protection of the first photo-resistor masking 5a, a first wet etching process is adopted to etch the metal thin-film layer 4.

(4) As shown in FIG. 1d, under the protection of the first photo-resistor masking 5a, the first dry etching process is adopted to etch the semiconductor thin-film layer 2 and the N+ doping thin-film layer 3 to obtain an active layer 2a.

(5) As shown in FIG. 1e, applying a plasma ashing process to the first photo-resistor masking 5a to obtain a second photo-resistor mask 5b such that a metal thin-film layer 4 is exposed from a middle area of the second photo-resistor mask 5b.

(6) As shown in FIG. 1f, under the protection of the second photo-resistor mask 5b, a second wet etching process is adopted to etch the metal thin-film layer 4 to obtain a source electrode 4a and a drain electrode 4b.

(7) As shown in FIG. 1g, under the protection of the second photo-resistor mask 5b, a second wet etching process is adopted to etch the N+ doping thin-film layer 3 to form the N+ contact layer 3a, 3b.

(8) As shown in FIG. 1h, the second photo-resistor mask 5b is removed.

In step (6), when the etching process is applied, due to the isotropic attribute, the lateral sides of the metal thin-film layer 4 are seriously etched such that edges of the source electrode 4a and the drain electrode 4b shrinkage when compared to the edge of the second photo-resistor mask 5b. As shown in FIG. 1f, in step (7), due to the anisotropy attribute of the dry etching process, the etched plasma crash vertically, the edges of the formed N+ contact layer 3a, 3b align with the edge of the second photo-resistor mask 5b, as shown in FIG. 1g. That is, as shown in FIG. 1h, the edges of the source electrode 4a and the drain electrode 4b do not smoothly transit into the corresponding edges of the N+ contact layer 3a, 3b. Instead, edges of the N+ contact layer 3a, 3b includes a protrusive tail 6 when being compared with the edges of the source electrode 4a and the drain electrode 4b. This may affect the length of the trench of the TFT, and may not be beneficial for the performance of the TFTs.

SUMMARY

To overcome the above issues, the present disclosure relates to an array substrate and the manufacturing method thereof. The method includes four masking processes for manufacturing the TFTs and the pixel electrode within the array substrate. The second masking process is enhanced such that the performance of the TFT may be enhanced.

In one aspect, a manufacturing method of array substrates, the method adopting four masking processes to obtain the array substrate and at least one pixel electrode within the array substrate, wherein a second masking process to form an active layer, a source electrode, and a drain electrode includes: forming a semiconductor thin-film layer, N+ doping thin-film layer, a metal thin-film layer, and a photo-resistor layer on a gate insulation layer in sequence; applying a gray-tone-mask process to expose and develop the photo-resistor layer to obtain a first photo-resistor mask; under protection of the first photo-resistor mask, applying a first wet etching process to etch a portion of the metal thin-film layer that is not covered by the first photo-resistor mask; under the protection of the first photo-resistor mask, applying a first dry etching process to etch portions of the semiconductor thin-film layer and the N+ doping thin-film layer that are not covered by the first photo-resistor mask to obtain the active layer; applying a plasma ashing process to the first photo-resistor mask to obtain a second photo-resistor mask, and the metal thin-film layer is exposed by a central area of the second photo-resistor mask; under the protection of the second photo-resistor mask, applying a second wet etching process to etch away a portion of the metal thin-film layer that is not covered by the second photo-resistor mask to obtain the source electrode and the drain electrode; and peeling off the second photo-resistor mask, applying a second dry etching process to etch away the portion of the N+ doping thin-film layer between the source electrode and the drain electrode to obtain the N+ contact layer respectively between the source electrode and the active layer and between the drain electrode and the active layer.

Wherein the method further includes: S1) applying a first masking process to the substrate to form a gate electrode; S2) forming the gate insulation layer covering the gate electrode on the substrate; S3) applying a second masking process to form the active layer, the source electrode and the drain electrode on the gate insulation layer; S4) forming a passivation layer covering at least one thin film transistor (TFT) on the substrate; S5) applying a third masking process to form at least one through hole within the passivation layer; and S6) applying a fourth masking process to form at least one pixel electrode on the passivation layer, wherein the pixel electrode electrically connects to one of the source electrode and the drain electrode via the through hole.

Wherein the semiconductor thin-film layer is made by hydrogenated amorphous silicon or polycrystalline silicon.

Wherein the semiconductor thin-film layer is made by a chemical vapor deposition (CVD) process.

Wherein the N+ doping thin-film layer is made by N+ amorphous silicon or N+ doping polysilicon.

Wherein the N+ doping thin-film layer is made by a CVD process.

Wherein the metal thin-film layer is made by a single-metal-layer of Cr, W, Ti, Ta, Mo, Al or Cu, or a composite-metal-layer made by any two or more than two of Cr, W, Ti, Ta, Mo, Al and Cu.

Wherein the metal thin-film layer is made by a sputtering process.

In another aspect, the array substrate is manufactured by the above method.

Yet in another aspect, a display device includes the above array substrate.

In view of the above, the array substrate and the manufacturing method thereof adopt four masking process to obtain the TFT and the pixel electrode. The second masking process forms the active layer, the source electrode and the drain electrode. After the second wet etching process, the source electrode and the drain electrode are obtained. The photo-resistor mask is peeled off and a second dry etching process is conducted. With respect to the TFT, the edges of the N+ contact layer align with edges of the source electrode and the drain electrode. The edge is configured with a protrusive tail, and the tail includes a substantially smooth transition. A width of the N+ contact layer may not affect the length of the trench of the active layer such that the performance of the TFT may be better.

BRIEF DESCRIPTION OF THE DRAWINGS

FIG. 1 is a schematic view of the liquid crystal device in accordance with one embodiment.

FIG. 2 is a schematic view of the array substrate in accordance with a first embodiment.

FIG. 3 is a flowchart illustrating the manufacturing method of the array substrate in accordance with the first embodiment.

DETAILED DESCRIPTION OF THE EMBODIMENTS

Figure 1A:
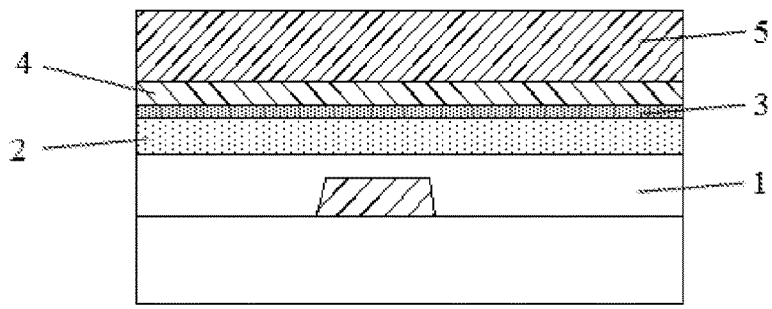
Referring to FIG. 1a-1h, the second masking process is adopted to form the active layer, the source electrode, and the drain electrode.
Figure 1B:
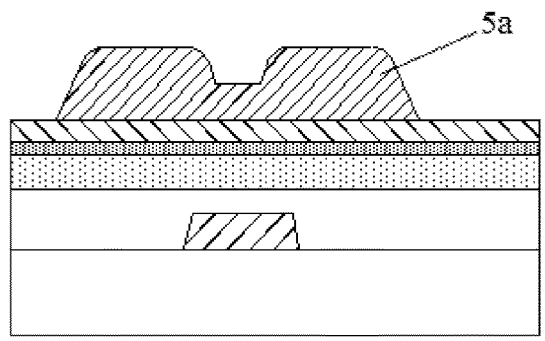
Figure 1C:
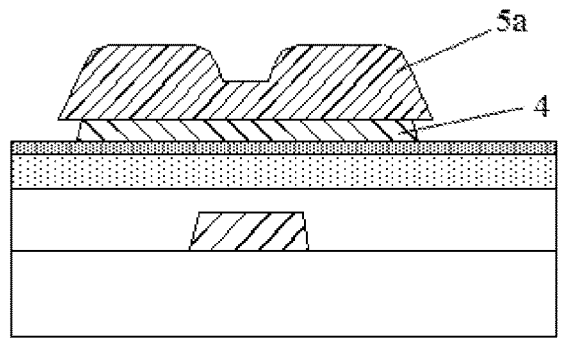
Figure 1D:
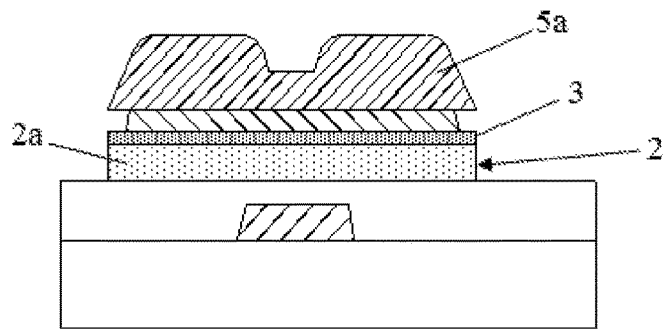
Figure 1E:
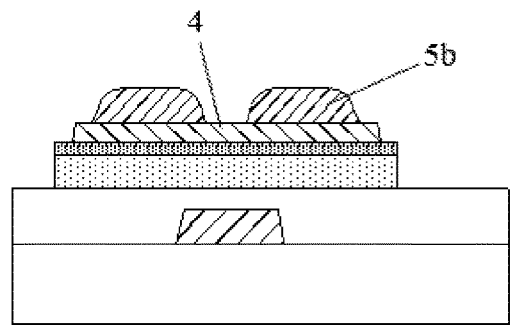
Figure 1F:
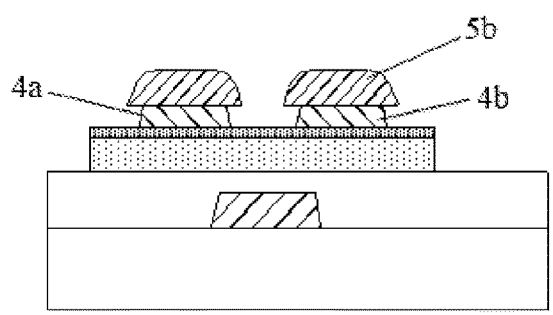
Figure 1G:
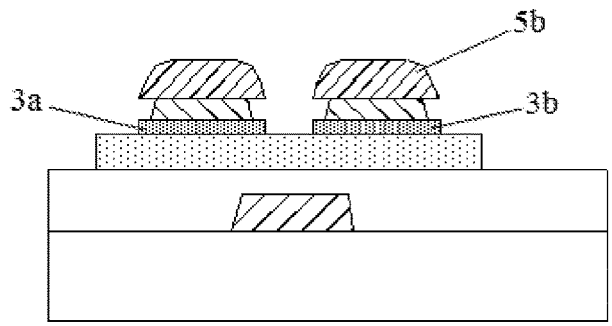
Figure 1H:
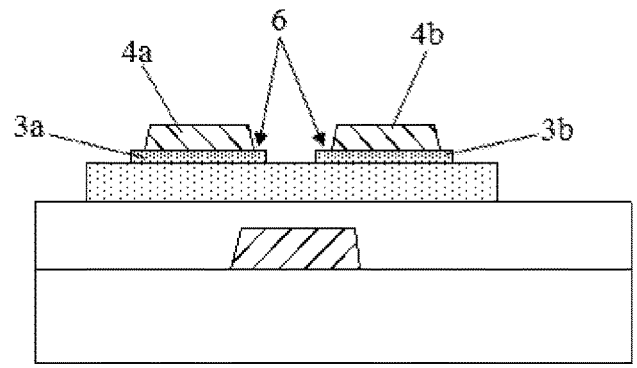
Figure 4:
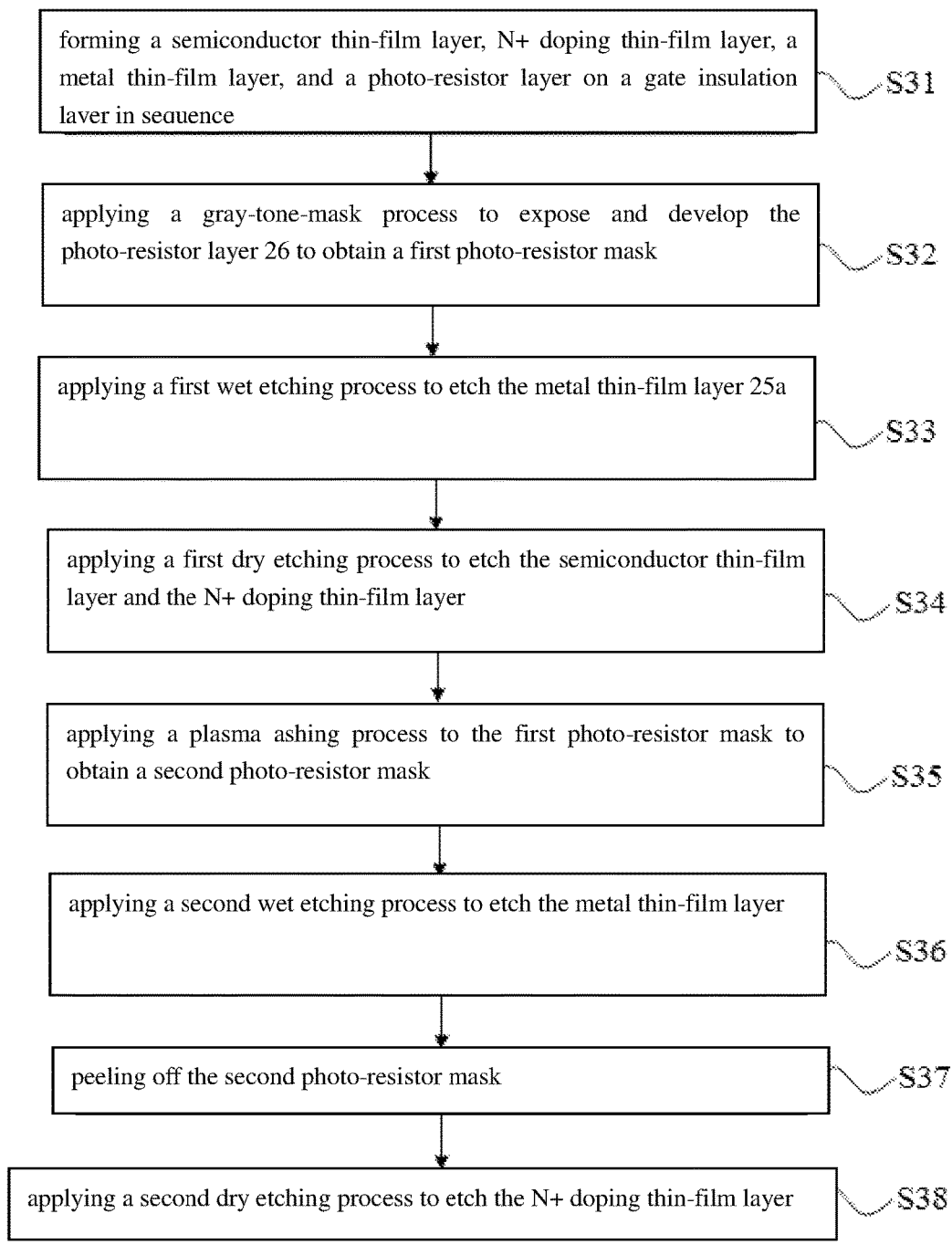
FIG. 4 is a flowchart illustrating the second masking process in accordance with the first embodiment.

Embodiments of the invention will now be described more fully hereinafter with reference to the accompanying drawings, in which embodiments of the invention are shown.

Various example embodiments will now be described more fully with reference to the accompanying drawings in which some example embodiments are shown. In the drawings, the thicknesses of layers and regions may be exaggerated for clarity. In the following description, in order to avoid the known structure and/or function unnecessary detailed description of the concept of the invention result in confusion, well-known structures may be omitted and/or functions described in unnecessary detail.

First Embodiment.

In one embodiment, the array substrate is a TFT array substrate. As shown in FIG. 2, the array substrate includes a plurality of TFTs 20 on the substrate 10 and at least one pixel electrode 30, and the pixel electrode 30 electrically connects to the TFT 20, wherein only one TFT 20 is shown in the drawing as one example.

Referring to FIG. 2, the TFT 20 includes a gate electrode 21, a gate insulation layer 22, an active layer 23, a source electrode 251, and a drain electrode 252, wherein the gate electrode 21 is formed on the substrate 10, the gate insulation layer 22 covers the gate electrode 21, the active layer 23 is formed on the gate insulation layer 22, the source electrode 251 and the drain electrode 252 are within the same structure layer formed on the active layer 23. Further, the source electrode 251 and the active layer 23 are connected via a N+ contact layer 241, the drain electrode 252 and the active layer 23 are connected via a N+ contact layer 242. A passivation layer 40 is formed on the TFT 20, the pixel electrode 30 electrically connects to the drain electrode 252 of the TFT 20 via a through hole within the passivation layer 40.

In the above array substrate, with respect to the TFT 20, the edges of the N+ contact layer 241, 242 align with edges of the source electrode 251 and the drain electrode 252. The edge is configured with a protrusive tail, and the tail includes a substantially smooth transition. A width of the N+ contact layer 241, 242 may not affect the length of the trench of the active layer 23 such that the performance of the TFT 20 may be better.

In the embodiment, the manufacturing method of the array substrate is disclosed, wherein four masking processes are adopted to form the TFT and the pixel electrode. Specifically, the method in FIG. 3 includes the following steps.

In step S1, applying a first masking process to the substrate to form a gate electrode.

This step may be completed by adopting a conventional one-time masking process, wherein the masking process includes coating, exposure, development, etching and peeling, and so on. The one-time masking process relates to a patterning process adopting one mask. For instance, a gate metal thin-film is deposited on the substrate 10, and coating the photo-resistor adhesive on the gate metal thin-film. Afterward, the gate masking is adopted to expose and develop the photo-resistor layer on the gate metal thin-film. The gate metal thin-film to be kept is covered with the photo-resistor adhesive, and the rest of the gate metal thin-film are removed. The etching step is adopted to etch away the gate metal thin-film, and the rest of the gate metal thin-film is the patterned gate 21 needed, wherein the gate metal thin-film is made by a single-metal-layer of Cr, W, Ti, Ta, Mo, Al or Cu, or a composite-metal-layer made by any two or more than two of Cr, W, Ti, Ta, Mo, Al and Cu. The process forming the gate metal thin-film may be a sputtering process, or other processes known by persons skilled in the art.

In step S2, forming a gate insulation layer covering the gate electrode on the substrate.

Specifically, the gate insulation layer 22 may be made by $SiO_x$ or $SiN_x$. The manufacturing process of forming the gate insulation layer 22 may be a chemical vapor deposition (CVD) process, or other process known by persons skilled in the art.

In step S3, applying a second masking process to form an active layer, a source electrode and a drain electrode on the gate insulation layer.

Figure 5A:
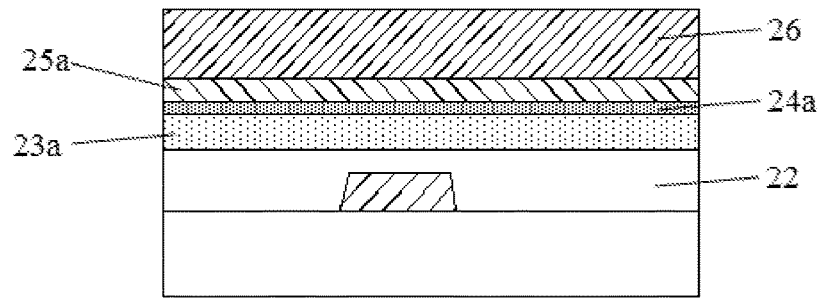
FIG. 5a-5h are schematic views showing the steps of the second masking process in accordance with the first embodiment.

Referring to FIG. 4 and FIGS. 5a-5h, the second masking process includes the following steps:

In step S31, as shown in FIG. 5a, forming a semiconductor thin-film layer 23a, N+ doping thin-film layer 24a, a metal thin-film layer 25a, and a photo-resistor layer 26 on a gate insulation layer in sequence, wherein the semiconductor thin-film layer 23a may be made by hydrogenated amorphous silicon or polycrystalline silicon, the manufacturing process forming the semiconductor thin-film layer 23a may be the CVD process, or other processes known by persons skilled in the art, the N+ doping thin-film layer 24a may be made by N+ amorphous silicon or N+ doping polysilicon, the manufacturing process forming the N+ doping thin-film layer 24a may be the CVF process, or other processes known by persons skilled in the art, the metal thin-film layer 25a may be made by a single-metal-layer of Cr, W, Ti, Ta, Mo, Al or Cu, or a composite-metal-layer made by any two or more than two of Cr, W, Ti, Ta, Mo, Al and Cu. The process forming the gate metal thin-film may be a sputtering process, or other processes known by persons skilled in the art.

Figure 5B:
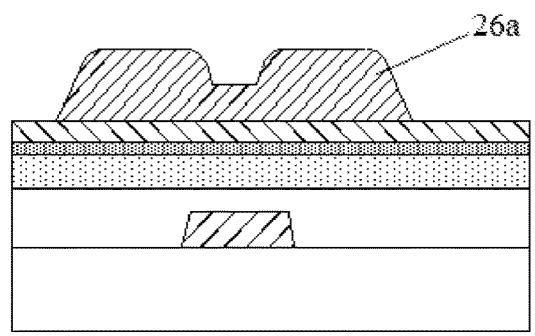

In step S32, as shown in FIG. 5b, applying a gray-tone-mask process to expose and develop the photo-resistor layer 26 to obtain a first photo-resistor mask 26a. Specifically, the first photo-resistor mask 26a includes a central area having a smaller thickness and two lateral areas having a greater thickness.

Figure 5C:
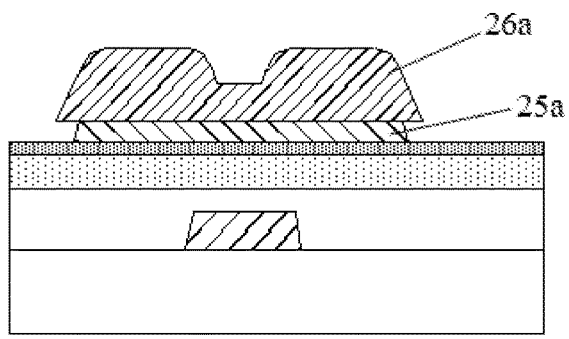

In step S33, as shown in FIG. 5c, under a protection of the first photo-resistor mask 26a, applying a first wet etching process to etch the metal thin-film layer 25a. This step mainly relates to remove a portion of the metal thin-film layer 25a that is not covered by the first photo-resistor mask 26a.

Figure 5D:
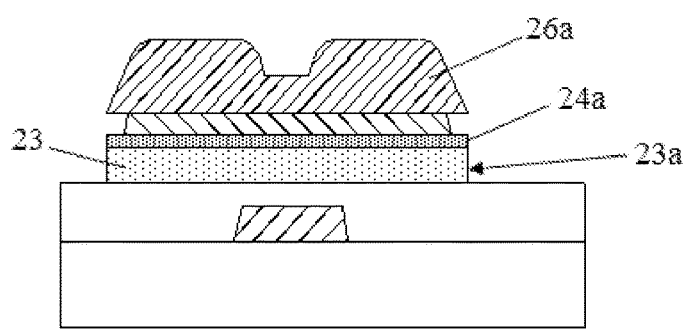

In step S34, as shown in FIG. 5d, under the protection of the first photo-resistor mask 26a, applying a first dry etching process to etch the semiconductor thin-film layer 23a and the N+ doping thin-film layer 24a. This step mainly relates to removing the portion of the semiconductor thin-film layer 23a and the N+ doping thin-film layer 24a that is not covered by the first photo-resistor mask 26a, wherein a remaining portion of the semiconductor thin-film layer 23a after the etching process forms the active layer 23 of the TFT 20.

Figure 5E:
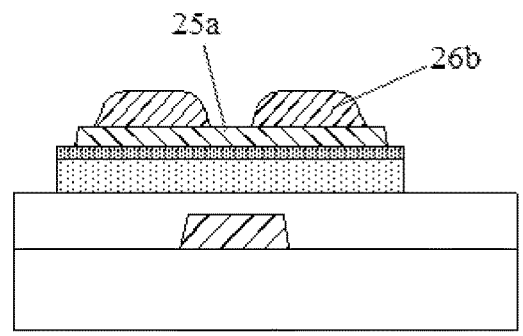

In step S35, as shown in FIG. 5e, applying a plasma ashing process to the first photo-resistor mask 26a to obtain a second photo-resistor mask 26b. Specifically, after applying the plasma ashing process to the first photo-resistor mask 26a, the thickness of the two lateral areas of the first photo-resistor mask 26a is decreased, and the central area having the smaller thickness is completely removed to form the second photo-resistor mask 26b. That is, the metal thin-film layer 25a is exposed by the central area of the second photo-resistor mask 26b.

Figure 5F:
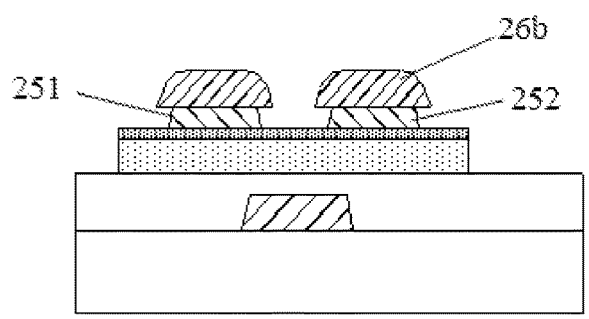

In step S36, as shown in FIG. 5f, under the protection of the second photo-resistor mask 26b, applying a second wet etching process to etch the metal thin-film layer 25a. This step mainly relates to remove the portion of the metal thin-film layer 25a that is not covered by the second photo-resistor mask 26b. That is, the portion of the metal thin-film layer 25a being exposed by the central area of the second photo-resistor mask 26b is removed, and the portions covered by the second photo-resistor mask 26b respectively form a source electrode 251 and a drain electrode 252. Due to the isotropic attribute of the wet etching process, the edges of the source electrode 251 and the drain electrode 252 shrink inward with respect to the second photo-resistor mask 26b.

Figure 5G:
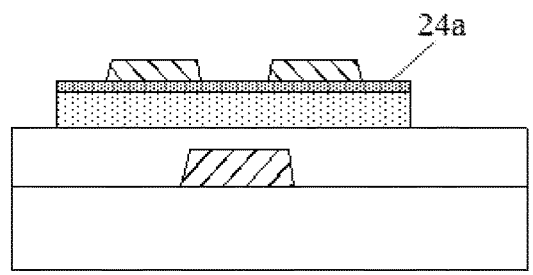

In step S37, as shown in FIG. 5g, peeling off the second photo-resistor mask 26b.

Figure 5H:
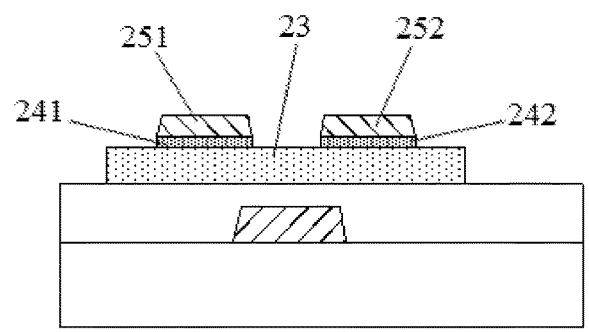

In step S38, as shown in FIG. 5h, applying a second dry etching process to etch the N+ doping thin-film layer 24a. This step etches away the portion of the N+ doping thin-film layer 24a between the source electrode 251 and the drain electrode 252 to obtain the N+ contact layer 241, 242 respectively between the source electrode 251 and the active layer 23 and between the drain electrode 252 and the active layer 23. In this step, as the second photo-resistor mask 26b is removed, the source electrode 251 and the drain electrode 252 operate as the mask when the N+ doping thin-film layer 24a is etched. Due to the anisotropy attribute of the dry etching process, the etched plasma crash vertically, the edges of the formed N+ contact layer 241, 242 align with the edge of the source electrode 251 and the drain electrode 252. The edges are configured with the protrusive tail, and the tail includes a substantially smooth transition. A width of the N+ contact layer 241, 242 may not affect the length of the trench of the active layer 23 such that the performance of the TFT 20 may be better.

In step S4, forming a passivation layer covering the TFT on the substrate.

Specifically, the passivation layer 40 may be made by $SiO_x$ or $SiN_x$. The manufacturing process of the passivation layer 40 may be the CVD process, or other process known by persons skilled in the art.

In step S5, applying a third masking process to form at least one through hole within the passivation layer.

Specifically, the photo-resistor adhesive is coated on the passivation layer 40, and a through-hole mask is adopted to expose and to develop the photo-resistor layer to remove the photo-resistor adhesive on the location configured to be the through hole. In the end, the through hole 41 is formed within the passivation layer 40 by the etching step.

In step S6, applying a fourth masking process to form at least one pixel electrode on the passivation layer.

Specifically, a pixel electrode thin-film is deposited on the passivation layer 40, and the photo-resistor adhesive is coated on the pixel electrode thin-film. The pixel electrode thin-film at least fills the through hole 41. Afterward, the pixel electrode mask is adopted to expose and to develop the photo-resistor layer, the pixel electrode thin-film to be kept is coated with the photo-resistor adhesive. The photo-resistor adhesive covering pixel electrode thin-film to be removed is removed. In the end, the pixel electrode thin-film is etched away, the rest of the pixel electrode thin-film is the patterned pixel electrode 30, wherein the pixel electrode 30 electrically connects to the drain electrode 252 via the through hole 41, wherein the pixel electrode thin-film may be made by ITO, and the process forming the pixel electrode thin-film may be a sputtering process, or other processes known by persons skilled in the art.

Figure 6:
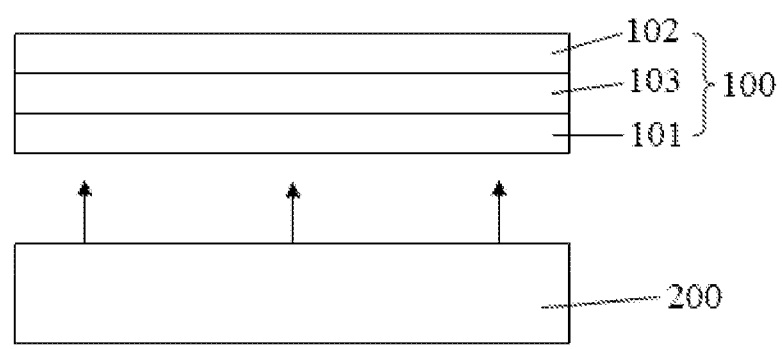
FIG. 6 is a schematic view of the display device in accordance with a second embodiment.

Second Embodiment:

A display device includes the above TFT array substrate in the first embodiment. The display device may be a TFT-LCD or an OLED adopting the TFT array substrate in the first embodiment such that the performance of the display device is better, and the cost may be lowered down. Specifically, the LCD in FIG. 6 includes a liquid crystal panel 100 and a backlight module 200 opposite to the liquid crystal panel 100. The backlight module 200 provides a display light source to the liquid crystal panel 100 such that the liquid crystal panel 100 can display the images, wherein the liquid crystal panel 100 includes an array substrate 101, a color-filter substrate 102, and a liquid crystal layer 103. The voltage detection circuit 101 adopts the TFT array substrate in the first embodiment.

It should be noted that the relational terms herein, such as "first" and "second", are used only for differentiating one entity or operation, from another entity or operation, which, however do not necessarily require or imply that there should be any real relationship or sequence. Moreover, the terms "comprise", "include" or any other variations thereof are meant to cover non-exclusive including, so that the process, method, article or device comprising a series of elements do not only comprise those elements, but also comprise other elements that are not explicitly listed or also comprise the inherent elements of the process, method, article or device. In the case that there are no more restrictions, an element qualified by the statement "comprises a . . . " does not exclude the presence of additional identical elements in the process, method, article or device that comprises the said element.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A manufacturing method of array substrates, the method adopting four masking processes to obtain the array substrate and at least one pixel electrode within the array substrate, wherein a second masking process to form an active layer, a source electrode, and a drain electrode comprising:

forming a semiconductor thin-film layer, N+ doping thin-film layer, a metal thin-film layer, and a photo-resistor layer on a gate insulation layer in sequence;

applying a gray-tone-mask process to expose and develop the photo-resistor layer to obtain a first photo-resistor mask;

under protection of the first photo-resistor mask, applying a first wet etching process to etch a portion of the metal thin-film layer that is not covered by the first photo-resistor mask;

under the protection of the first photo-resistor mask, applying a first dry etching process to etch portions of the semiconductor thin-film layer and the N+ doping thin-film layer that are not covered by the first photo-resistor mask to obtain the active layer;

applying a plasma ashing process to the first photo-resistor mask to obtain a second photo-resistor mask, and the metal thin-film layer is exposed by a central area of the second photo-resistor mask;

under the protection of the second photo-resistor mask, applying a second wet etching process to etch away a portion of the metal thin-film layer that is not covered by the second photo-resistor mask to obtain the source electrode and the drain electrode; and peeling off the second photo-resistor mask, applying a second dry etching process to etch away the portion of the N+ doping thin-film layer between the source electrode and the drain electrode to obtain the N+ contact layer respectively between the source electrode and the active layer and between the drain electrode and the active layer.

2. The manufacturing method of array substrates as claimed in claim 1, wherein the method further comprises:

S1) applying a first masking process to the substrate to form a gate electrode;

S2) forming the gate insulation layer covering the gate electrode on the substrate;

S3) applying a second masking process to form the active layer, the source electrode and the drain electrode on the gate insulation layer;

S4) forming a passivation layer covering at least one thin film transistor (TFT) on the substrate;

S5) applying a third masking process to form at least one through hole within the passivation layer; and S6) applying a fourth masking process to form at least one pixel electrode on the passivation layer, wherein the pixel electrode electrically connects to one of the source electrode and the drain electrode via the through hole.

3. The manufacturing method of array substrates as claimed in claim 2, wherein the semiconductor thin-film layer is made by hydrogenated amorphous silicon or polycrystalline silicon.

4. The manufacturing method of array substrates as claimed in claim 3, wherein the semiconductor thin-film layer is made by a chemical vapor deposition (CVD) process.

5. The manufacturing method of array substrates as claimed in claim 2, wherein the metal thin-film layer is made by a single-metal-layer of Cr, W, Ti, Ta, Mo, Al or Cu, or a composite-metal-layer made by any two or more than two of Cr, W, Ti, Ta, Mo, Al and Cu.

6. The manufacturing method of array substrates as in claim 5, wherein the metal thin-film layer is made by a sputtering process.

7. The manufacturing method of array substrates as claimed in claim 2, wherein the N+ doping thin-film layer is made by N+ amorphous silicon or N+ doping polysilicon.

8. The manufacturing method of array substrates as claimed in claim 7, wherein the N+ doping thin-film layer is made by a CVD process.

9. An array substrate made by the manufacturing method adopting four masking processes to obtain the array substrate and at least one pixel electrode within the array substrate, wherein a second masking process to form an active layer, a source electrode, and a drain electrode comprising:

forming a semiconductor thin-film layer, N+ doping thin-film layer, a metal thin-film layer, and a photo-resistor layer on a gate insulation layer in sequence;

applying a gray-tone-mask process to expose and develop the photo-resistor layer to obtain a first photo-resistor mask;

under protection of the first photo-resistor mask, applying a first wet etching process to etch a portion of the metal thin-film layer that is not covered by the first photo-resistor mask;

under the protection of the first photo-resistor mask, applying a first dry etching process to etch portions of the semiconductor thin-film layer and the N+ doping thin-film layer that are not covered by the first photo-resistor mask to obtain the active layer;

applying a plasma ashing process to the first photo-resistor mask to obtain a second photo-resistor mask, and the metal thin-film layer is exposed by a central area of the second photo-resistor mask;

under the protection of the second photo-resistor mask, applying a second wet etching process to etch away a portion of the metal thin-film layer that is not covered by the second photo-resistor mask to obtain the source electrode and the drain electrode; and peeling off the second photo-resistor mask, applying a second dry etching process to etch away the portion of the N+ doping thin-film layer between the source electrode and the drain electrode to obtain the N+ contact layer respectively between the source electrode and the active layer and between the drain electrode and the active layer.

10. The array substrate as claimed in claim 9, wherein the method further comprises:
S1) applying a first masking process to the substrate to form a gate electrode;
S2) forming the gate insulation layer covering the gate electrode on the substrate;
S3) applying a second masking process to form the active layer, the source electrode and the drain electrode on the gate insulation layer;
S4) forming a passivation layer covering at least one thin film transistor (TFT) on the substrate;
S5) applying a third masking process to form at least one through hole within the passivation layer; and
S6) applying a fourth masking process to form at least one pixel electrode on the passivation layer, wherein the pixel electrode electrically connects to one of the source electrode and the drain electrode via the through hole.

11. The array substrate as claimed in claim 10, wherein the semiconductor thin-film layer is made by hydrogenated amorphous silicon or polycrystalline silicon, and the semiconductor thin-film layer is made by a chemical vapor deposition (CVD) process.

12. The array substrate as claimed in claim 10, wherein the N+ doping thin-film layer is made by N+ amorphous silicon or N+ doping polysilicon, and the N+ doping thin-film layer is made by a CVD process.

13. The array substrate as claimed in claim 10, wherein the metal thin-film layer is made by a single-metal-layer of Cr, W, Ti, Ta, Mo, Al or Cu, or a composite-metal-layer made by any two or more than two of Cr, W, Ti, Ta, Mo, Al and Cu, and wherein the metal thin-film layer is made by a sputtering process.

14. A display device, comprising:
an array substrate made by the manufacturing method adopting four masking processes to obtain the array substrate and at least one pixel electrode within the array substrate, wherein a second masking process to form an active layer, a source electrode, and a drain electrode comprising:

forming a semiconductor thin-film layer, N+ doping thin-film layer, a metal thin-film layer, and a photo-resistor layer on a gate insulation layer in sequence;

applying a gray-tone-mask process to expose and develop the photo-resistor layer to obtain a first photo-resistor mask;

under protection of the first photo-resistor mask, applying a first wet etching process to etch a portion of the metal thin-film layer that is not covered by the first photo-resistor mask;

under the protection of the first photo-resistor mask, applying a first dry etching process to etch portions of the semiconductor thin-film layer and the N+ doping thin-film layer that are not covered by the first photo-resistor mask to obtain the active layer;

applying a plasma ashing process to the first photo-resistor mask to obtain a second photo-resistor mask, and the metal thin-film layer is exposed by a central area of the second photo-resistor mask;

under the protection of the second photo-resistor mask, applying a second wet etching process to etch away a portion of the metal thin-film layer that is not covered by the second photo-resistor mask to obtain the source electrode and the drain electrode; and peeling off the second photo-resistor mask, applying a second dry etching process to etch away the portion of the N+ doping thin-film layer between the source electrode and the drain electrode to obtain the N+ contact layer respectively between the source electrode and the active layer and between the drain electrode and the active layer.

15. The display device as claimed in claim 14, wherein the method further comprises:
S1) applying a first masking process to the substrate to form a gate electrode;
S2) forming the gate insulation layer covering the gate electrode on the substrate;
S3) applying a second masking process to form the active layer, the source electrode and the drain electrode on the gate insulation layer;
S4) forming a passivation layer covering at least one thin film transistor (TFT) on the substrate;
S5) applying a third masking process to form at least one through hole within the passivation layer; and
S6) applying a fourth masking process to form at least one pixel electrode on the passivation layer, wherein the pixel electrode electrically connects to one of the source electrode and the drain electrode via the through hole.

16. The display device as claimed in claim 14, wherein the semiconductor thin-film layer is made by hydrogenated amorphous silicon or polycrystalline silicon, and the semiconductor thin-film layer is made by a chemical vapor deposition (CVD) process.

17. The display device as claimed in claim 14, wherein the N+ doping thin-film layer is made by N+ amorphous silicon or N+ doping polysilicon, and the N+ doping thin-film layer is made by a CVD process.

18. The display device as claimed in claim 14, wherein the metal thin-film layer is made by a single-metal-layer of Cr, W, Ti, Ta, Mo, Al or Cu, or a composite-metal-layer made by any two or more than two of Cr, W, Ti, Ta, Mo, Al and Cu, and wherein the metal thin-film layer is made by a sputtering process.

* * * * *